United States Patent
Alvarez

[19]

[11] Patent Number: 6,167,349
[45] Date of Patent: Dec. 26, 2000

[54] BATTERY PARAMETER MEASUREMENT

[75] Inventor: Jose A. Alvarez, Elizabeth, N.J.

[73] Assignee: BTECH, Inc., Whippany, N.J.

[21] Appl. No.: 09/053,906

[22] Filed: Apr. 2, 1998

[51] Int. Cl.[7] .......................... G01R 31/36; G06F 19/00; G01N 27/416
[52] U.S. Cl. .............................. 702/63; 324/430
[58] Field of Search ............ 702/63, 64, FOR 103–105; 320/126, 132, 134, 136; 324/425–427, 429, 430, 432, 434, 444

[56] References Cited

U.S. PATENT DOCUMENTS

| | | | |
|---|---|---|---|
| 4,017,724 | 4/1977 | Finger ........................................ | 702/63 |
| 4,044,300 | 8/1977 | Dupuis et al. ........................... | 324/434 |
| 4,204,162 | 5/1980 | Froidevaux .............................. | 324/430 |
| 4,259,639 | 3/1981 | Renirie .................................... | 324/430 |
| 4,423,379 | 12/1983 | Jacobs et al. ........................... | 324/429 |
| 4,678,998 | 7/1987 | Maramatsu .............................. | 324/427 |
| 4,719,427 | 1/1988 | Morishita et al. ....................... | 324/427 |
| 5,281,920 | 1/1994 | Wurst ....................................... | 324/430 |
| 5,369,364 | 11/1994 | Renirie et al. ........................... | 324/430 |
| 5,598,098 | 1/1997 | Champlin ................................ | 324/430 |
| 5,705,929 | 1/1998 | Caravello et al. ...................... | 324/430 |

FOREIGN PATENT DOCUMENTS

| | | |
|---|---|---|
| 9038443 | 2/1997 | Japan . |
| 9744652 | 11/1997 | WIPO . |
| 9853335 | 11/1998 | WIPO . |

OTHER PUBLICATIONS

Roberge, P.R. and Salvador, J.P. Testing and Evaluation of Tubular Positive Lead–Acid Batteries. 1995 Proceedings of the Tenth Annual Battery Conference on Applications and Advances. pp. 147–151.

Konya Y T et al—"A Deterioration Estimating System for 200–AH Sealed Lead–Acid Batteries" Oct. 30–Nov. 3, 1994 No. Conf. 16, Oct. 30, 1994, pp. 256–262.

Debardelabel SL—"A look at the impedance of a cell"—Oct. 30, Nov. 2, 1988 pp. 394–397, 1988 NY, NY, USA, IEEE, USA see whole document.

*Primary Examiner*—Marc S. Hoff
*Assistant Examiner*—Manuel L. Barbee
*Attorney, Agent, or Firm*—David L. Davis

[57] ABSTRACT

A method and system for evaluating lead-acid battery jars in a battery backup or standby system applies, in a stepwise manner, a current load across a group of adjacent jars. Voltage measurements are taken across each jar in the group at various times during the application of the current load. These measurements are utilized to calculate the ohmic resistance, the charge transfer resistance and the double layer capacitance of each jar.

12 Claims, 6 Drawing Sheets

BATTERY PARAMETER MEASUREMENT

BACKGROUND OF THE INVENTION

This invention relates to battery backup and standby systems having from one to a large number of jars and, more particularly, to the measurement of jar parameters for use in determining the status of the jar(s).

For lead-acid batteries, it is known in the art that some of the primary measures of battery jar health are the electrolyte resistance, the charge transfer resistance and the double layer capacitance. It is important that the electrolyte solution have the proper acid concentration, which is related to the amount of charge in the jar, and this can be determined by examining the resistance of the electrolyte, which should lie within a defined range. However, the actual electrolyte resistance cannot be measured by itself, since it is only one component (albeit the major one) of the overall ohmic resistance of the jar, which also includes the resistance of the jar grids, terminals, and interconnections or straps. But since the electrolyte resistance is the largest part of the overall ohmic resistance in a properly maintained corrosion-free installation, examining the overall ohmic resistance can provide an indication of the specific gravity of the electrolyte solution. The charge transfer resistance is the resistance between the battery plate and the electrolyte solution, and is related to the condition of the interface between the plate and the electrolyte. Ideally, the charge transfer resistance is zero, but it is considered acceptable if it is below some predetermined value. The plate/electrolyte interface can best be described as two rigid layers of ions which form what is referred to as a "Helmholtz double layer". With increasing plate sulphation and/or grid corrosion, there is less surface area for the inner layer of ions to adsorb to the plate and consequently fewer ions are present in the outer layer closest to the electrolyte. The resultant capacitance (also known as the "double layer capacitance") provides a measure of the plate surface area which is free of sulphation and/or corrosion, and measuring the decrease in capacitance over time provides an indication of the rate of the electrochemical deterioration of the jar. With increasing plate sulphation and/or corrosion, there is a corresponding increase in the charge transfer resistance as well.

It would therefore be desirable to be able to measure the ohmic resistance, the charge transfer resistance and the double layer capacitance of a battery jar, and to be able to do so while the battery jars are on-line in the backup or standby system.

SUMMARY OF THE INVENTION

According to the present invention, a stepped current load is applied to a battery jar and voltage measurements across the jar are taken. The initial voltage change across the jar in response to the applied current load, when divided by the current, is equal to the ohmic resistance of the jar. The difference between the initial voltage change and the final (extrapolated) voltage of the jar, when divided by the applied current, is equal to the charge transfer resistance of the jar. By calculating the time constant of the voltage response of the jar to the stepped load and dividing the calculated time constant by the charge transfer resistance, the jar's double layer capacitance is obtained.

In accordance with an aspect of this invention, the current load is applied in the form of a series of high frequency pulses and low frequency pulses. The short duration, high frequency, pulses are used for calculating the ohmic resistance. The long duration, low frequency, pulses are used for calculating the charge transfer resistance and the double layer capacitance of the jar.

A system according to the present invention may be utilized for evaluating the condition of each of a plurality of rechargeable battery jars arranged in at least one parallel connected string of serially connected jars, with the jars of each string being divided into at least two groups. The system includes a switchable current load and a first controllable switch bank associated with each of the strings. The first switch bank is controllable for selectively coupling the current load across a selected group of adjacent jars in that string. The system also includes a bus system, voltage measurement modules coupled to the bus system, a current measurement system coupled to the bus system and a controller coupled to the bus system. There is a voltage measurement module associated with each group of adjacent jars in each string and each voltage measurement module includes a pair of voltage measurement terminals and a second controllable switch bank associated with the jars of that group. The second switch bank is controllable for selectively coupling one jar of the group at a time across the pair of voltage measurement terminals. The voltage measurement module is effective to collect data indicative of the voltage across the pair of voltage measurement terminals. The current measurement system is coupled to the switchable current load to collect data indicative of test current. The controller is effective to control the operation of the current load and the first controllable switch bank, and is further effective to transmit control signals over the bus system to actuate each voltage measurement module to control its second controllable switch bank and collect voltage data from the jars of the associated group of jars. The controller also collects test current data over the bus system from the current measurement system. A computer is coupled to the controller and is effective to cause the controller to control the current load, the first controllable switch bank, each voltage measurement module and the current measurement system so that the current load is applied in a stepwise manner to each group of adjacent jars one at a time, the voltage measurement module associated with that group collects voltage data from each jar during the stepwise application of current load to that group, and the current measurement system collects test current measurement data. The computer is further effective to collect all of the voltage and current measurement data and to utilize the collected data to calculate at least one of the ohmic resistance, the charge transfer resistance and the double layer capacitance for each of the cells.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
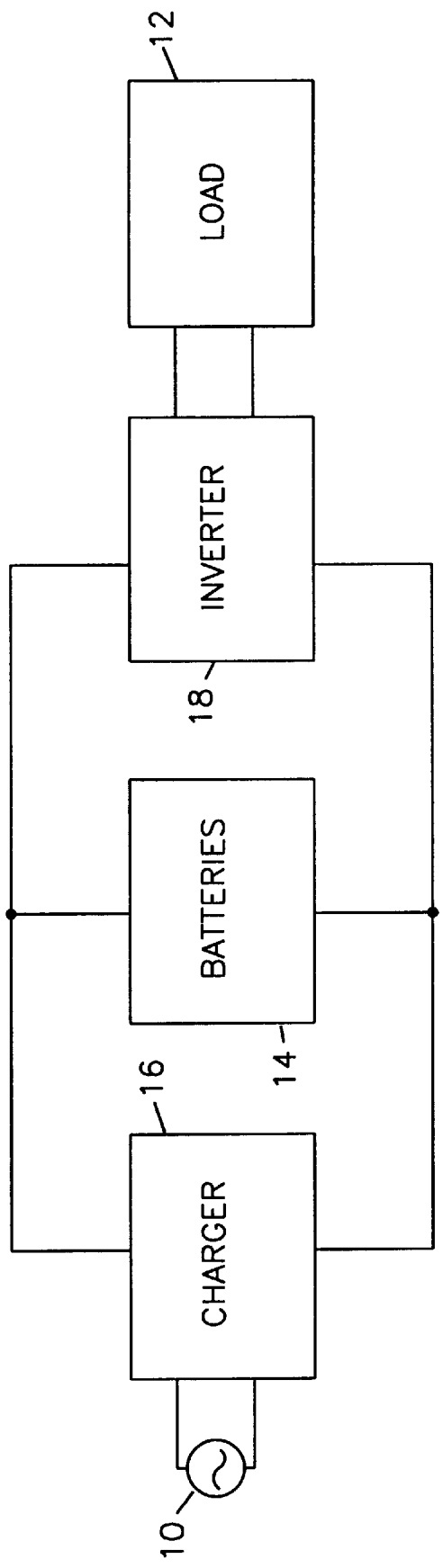
FIG. 1 is an overall block diagram of a prior art battery backup system in which the present invention finds utility.

Referring now to the drawings, FIG. 1 illustrates a typical prior art battery backup system coupled to the commercial power grid 10. The backup system is adapted to provide power to the load 12 upon detection of failure of the power grid 10. What is not shown in FIG. 1 is the direct connection of the load 12 to the power grid 10 and the arrangement which disconnects the load 12 from the power grid 10 upon detection of the power grid failure, such arrangement being conventional and well known in the art.

The battery backup system shown in FIG. 1 includes a bank of batteries 14 connected to a charger 16 and an inverter 18. The battery bank 14 typically comprises at least one string of serially connected rechargeable battery jars. The charger 16 maintains the battery jars within the battery bank 14 at their full level of charge when the power grid 10 is operational, as is well known. Upon detection of a failure of the power grid 10, the inverter 18 becomes operative to transform energy from the battery bank 14 into the same form normally provided by the power grid 10 and supply such transformed energy to the load 12, so that the load 12 does not see any interruption of power. Typically, the power grid 10 provides alternating current so that the inverter 18 functions to convert the direct current provided by the battery bank 14 into alternating current. The foregoing is conventional and well known in the art and will not be described in any further detail.

In the following discussion, reference will be made to battery jars. It is well understood in the art that rechargeable lead-acid batteries, with which the present invention is particularly adapted for use, are provided in the form of one or more cells enclosed within a "Jar", at which positive and negative voltage terminals are accessible.

Figure 2:
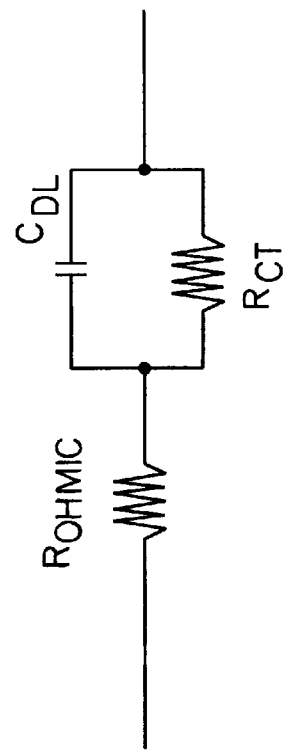
FIG. 2 illustrates a simplified equivalent circuit for a model of a battery jar, which is useful for understanding this invention.

FIG. 2 shows a simplified equivalent circuit diagram for a model lead-acid battery jar. As shown, the jar can be considered to include the ohmic resistance $R_{OHMIC}$ in series with the parallel combination of the charge transfer resistance $R_{CT}$ and the double layer capacitance $C_{DL}$. The voltage response of the battery jar to a stepwise applied current load has the general form:

$$V(t)=V_{OHMIC}(t)+V_{CT}(1-\exp(-t/R_{CT}C_{DL})).$$

Figure 3:
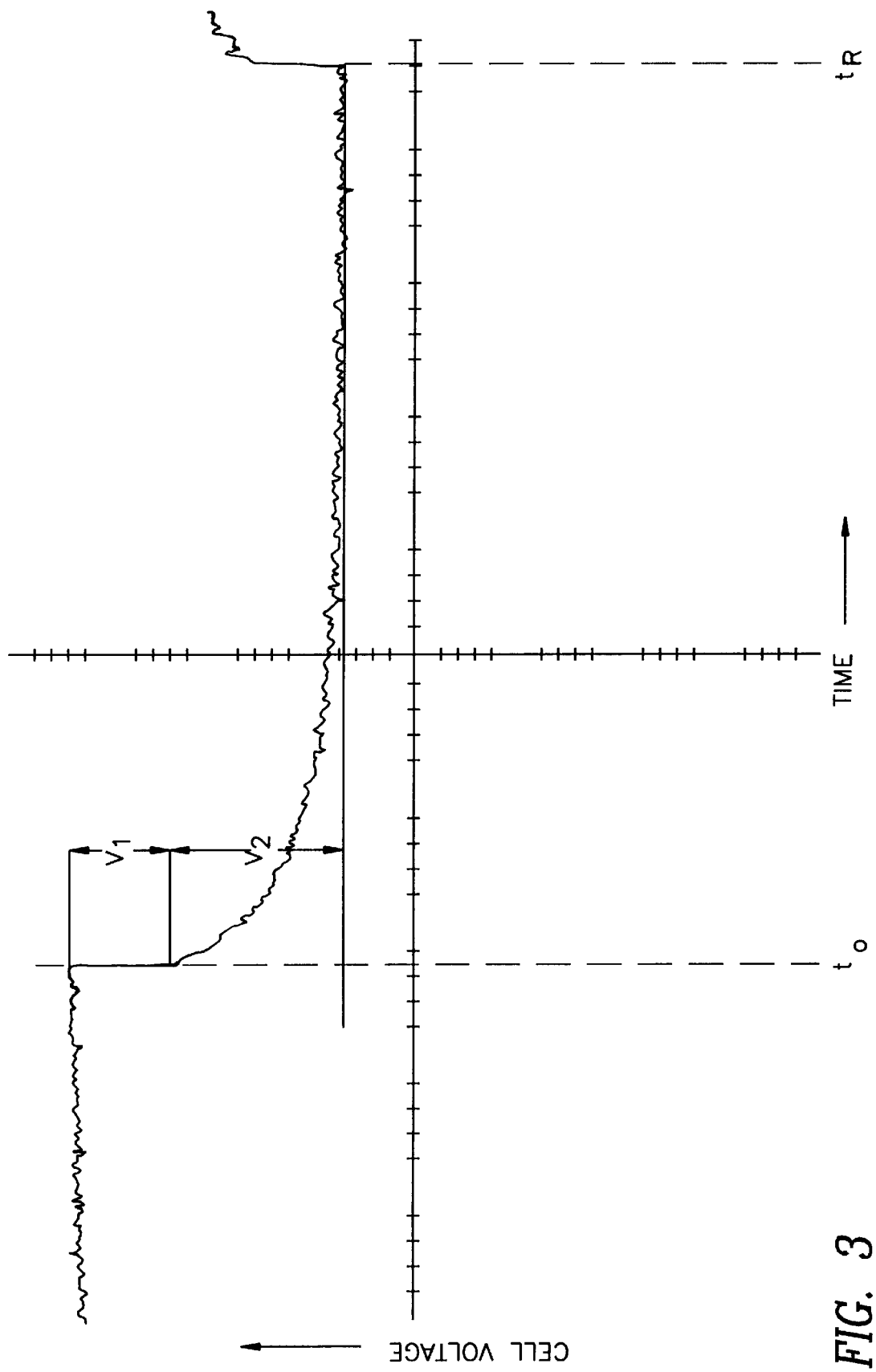
FIG. 3 illustrates the voltage response of a battery jar to a stepped pulse of load current.

FIG. 3 illustrates the actual voltage across a battery jar in response to a stepped pulse of load current. The load is applied at the time $t_0$. Prior to the time $t_0$, the voltage across the battery jar is substantially constant, having broadband noise superimposed thereon. Immediately upon application of the load current, the jar voltage drops by an amount equal to $V_1$. This is the drop across the ohmic resistance of the battery jar. As discussed above, the major component of the ohmic resistance is the electrolyte resistance of the battery jar. Therefore, by measuring this voltage drop and dividing by the applied current, the ohmic resistance of the battery jar is determined. The remaining exponential change in voltage is due to the parallel combination of the charge transfer resistance and the double layer capacitance, with the time constant of that exponential change being the product of the charge transfer resistance and the double layer capacitance. The voltage drop $V_2$ between the initial voltage drop $V_1$ and the final (extrapolated) steady state voltage across the jar is equal to the charge transfer resistance times the applied current load. Therefore, by determining the final steady state voltage across the jar and subtracting from it the measured voltage drop $V_1$, this is divided by the applied current load to determine the charge transfer resistance. By calculating the time constant of the exponential portion of the response and dividing the calculated time constant by the determined charge transfer resistance, the double layer capacitance is obtained. When the current load is removed at the time $t_R$, the voltage response of the battery jar is the inverse of its response to the application of the current load.

According to the present invention, a stepped current load is applied to a battery jar and the voltage across the jar is measured at various times. These voltage measurements are utilized to calculate the ohmic resistance, the charge transfer resistance and the double layer capacitance of the jar. Thus, the voltage across the jar is measured at least once prior to the time $t_0$ to obtain a baseline unloaded voltage. If such measurements are taken several times and averaged, the effects of broadband noise are reduced. The voltage across the jar is then measured immediately after the time $t_0$ to obtain the voltage drop $V_1$. Two or more measurements are then taken prior to the time $t_R$ and curve fitting techniques are utilized to obtain an exponential curve from which the voltage drop $V_2$ and the exponential time constant are determined.

Figure 4:
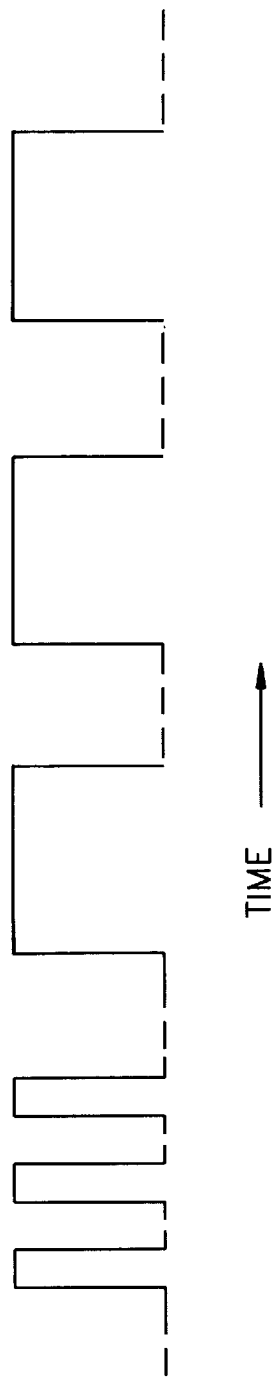
FIG. 4 illustrates a load current control signal pulse stream according to the present invention.

It is preferred that a series of current pulses be applied to the jar and measurements taken during each of those pulses to cancel out the effects of broadband noise. Although it is possible to use a relatively long load pulse to take voltage measurements and obtain all the desired information, there are reasons why this would be disadvantageous. Thus, in order to cancel out broadband noise to obtain a reliable measurement of the initial voltage drop $V_1$, a large number of pulses are required. If long pulses are used, this results in an undesired draining of charge from the battery jar. It is therefore preferred to use several short duration pulses to obtain the voltage drop $V_1$ and fewer longer duration pulses to determine the voltage drop $V_2$ and the exponential time constant. Thus, a pulse train of the type illustrated in FIG. 4 is preferred. Illustratively, the pulse train comprises twenty short duration (high frequency) pulses and three long duration (low frequency) pulses. Preferably, the short high frequency pulses will have a time duration between about 0.5 ms to about 10 ms and the long low frequency pulses will have a time duration between about 1 ms to about 50 ms, with about one second between pulses. This will keep the test time for each jar to less than one minute, which is desirable since a large battery backup system may comprise upwards of 256 jars.

Figure 5:
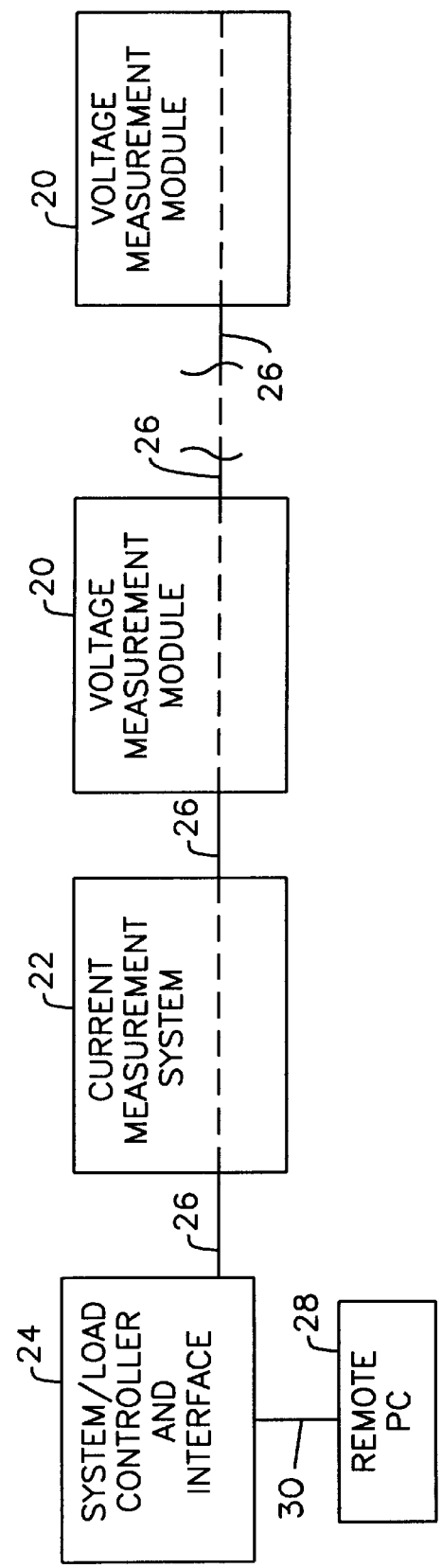
FIG. 5 is an overall block diagram of a system constructed in accordance with the present invention for evaluating the status of battery jars in the system of FIG. 1.

FIG. 5 shows in block diagram form a system for practicing the present invention. Before describing the system shown in FIG. 5, a discussion of the battery bank 14 is in order. The battery bank 14 comprises a number of parallel strings of serially connected battery jars. Illustratively, each string includes thirty two serially connected jars and there are eight such strings connected in parallel, for a total of two hundred fifty six (256) battery jars. It is understood that this number is for illustrative purposes only, and any particular battery backup or standby system may have more or fewer strings each with more or fewer jars.

As shown in FIG. 5, the battery evaluation system includes a plurality of voltage measurement modules 20, a current measurement system 22, and a system/load controller and interface 24, all interconnected via a bus system 26, which is preferably an asynchronous serial communications bus. A remote personal computer 28 is coupled to the system/load controller and interface 24 via a communications link 30, which may be a hard-wired connection, a modem, or any other appropriate link. According to the present invention, each string within the battery bank 14 is divided into quarters, and there is a voltage measurement module 20 dedicated to each such quarter.

Figure 6:
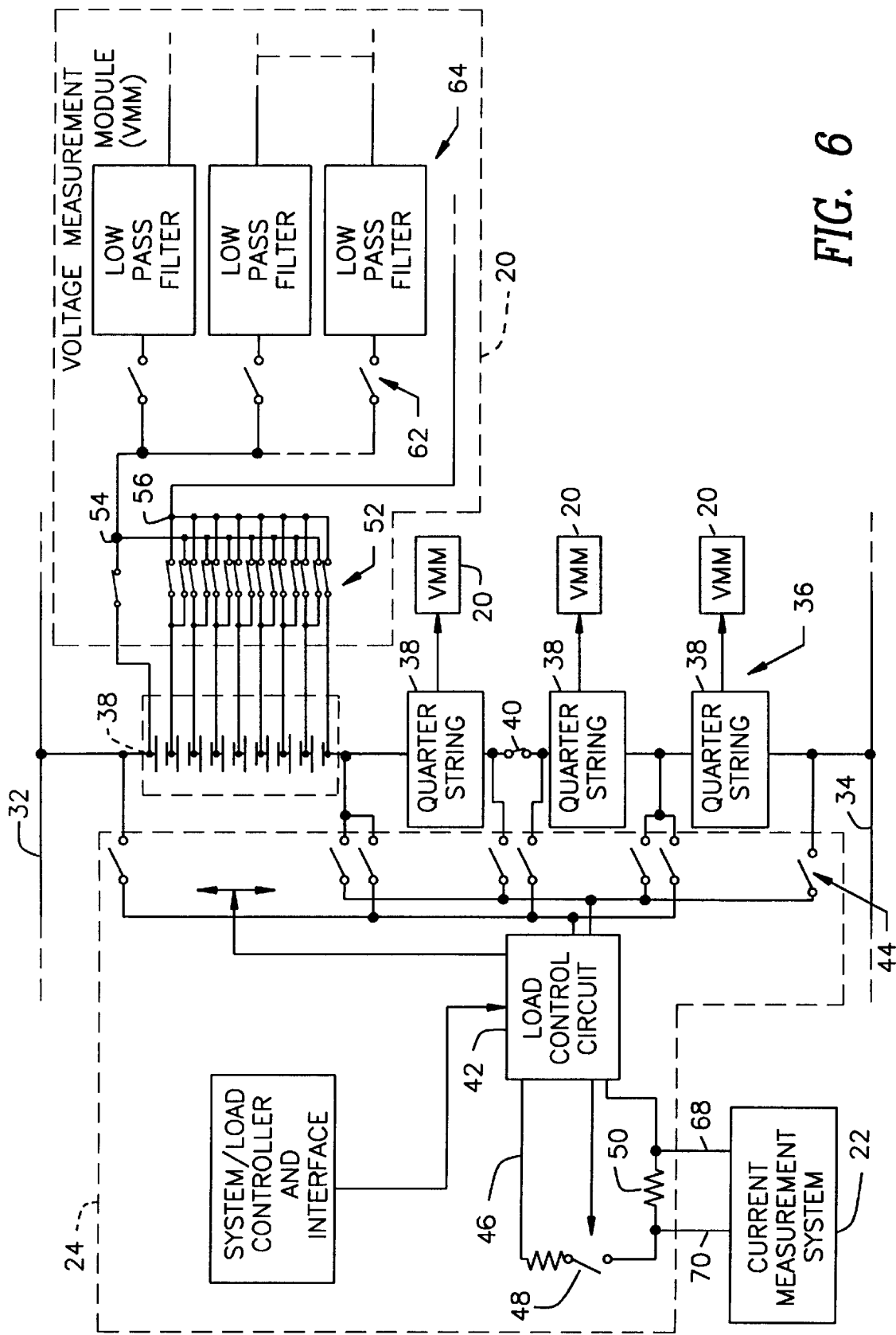
FIG. 6 is a block diagram of the data acquisition portion of the system shown in FIG. 5, showing a portion of a voltage measurement module.

FIG. 6 illustrates the data acquisition portion of the system shown in FIG. 5, coupled to one string of the battery bank 14. As is conventional, within the battery bank 14 the battery strings are connected in parallel between a first rail 32 and a second rail 34. Only one string 36 is illustrated herein and, as shown, the string 36 is divided into four serially connected quarters 38, with each quarter being made up of eight serially connected battery jars. It is understood that the string need not be divided into equal quarters in order to practice the present invention. In any event, substantially centrally of each string may be a central disconnect switch 40, which forms no part of the present invention, but is utilized to remove the string from the battery bank 14.

The system/load controller and interface 24 includes a load control circuit 42 which has a controllable switch bank 44 associated with each of the strings. The switch bank 44 is controllable for selectively coupling the load control circuit 42 across a selected quarter string 38. The current load used for battery jar measurements is generated within the current path 46, there being a controllable switch 48 by means of which the long and short duration current pulses are generated. A sensing resistor 50 is provided in the current path 46, across which is connected the current measurement system 22.

Figure 7:
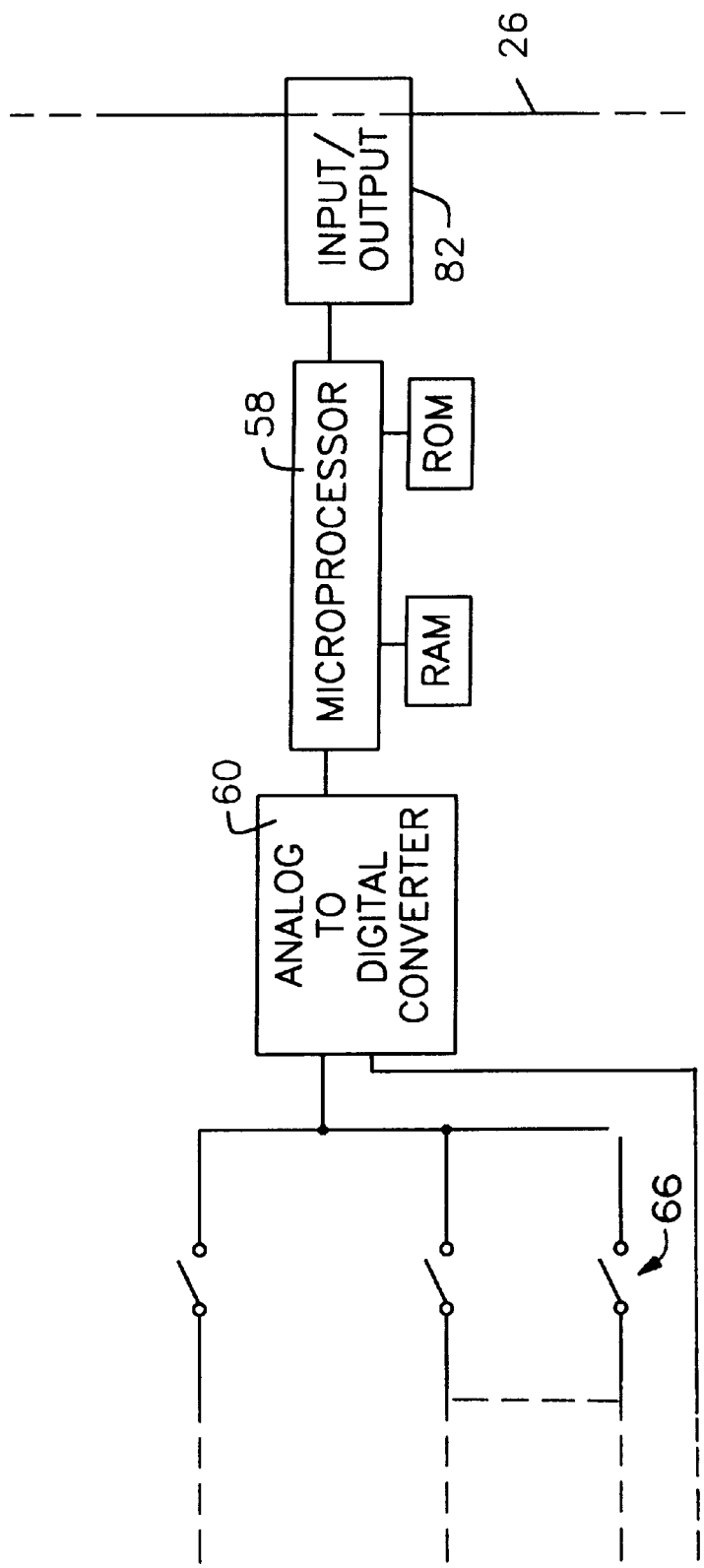
FIG. 7 is a block diagram showing the remaining portion of the voltage measurement module.

Each voltage measurement module 20 includes a switch bank 52 coupled between the individual jars within the associated quarter string 38 and a pair of voltage measurement terminals 54, 56. The switch bank 52 is controllable by the microprocessor 58 (FIG. 7) within the voltage measurement module 20 to selectively couple the jars within the quarter string 38 one at a time across the pair of voltage measurement terminals 54, 56. The voltage measurement terminal 56 is connected directly to the analog to digital converter 60. The other voltage measurement terminal 54 is connected through the switches 62 to the low pass filters 64, then through the switches 66 to the analog to digital converter 60. When the voltage measurement module 20 is activated and one of the battery jars within the quarter string 38 is connected to the voltage measurement terminals 54, 56, the switches 62 are all closed and the switches 66 are all open. During a current load pulse, the switches 62 are opened one at a time so that a time-related sequence of voltage measurements are held in the low pass filters 64. The timing of the opening of the switches 62 corresponds to the times when measurements are taken. The switches 66 are then sequentially closed to transfer these voltage measurements to the analog to digital converter. Alternatively, a single low pass filter with a very long time constant and one set of switches 62, 66 can be utilized. However, the double layer capacitance cannot be computed in this case.

Figure 8:
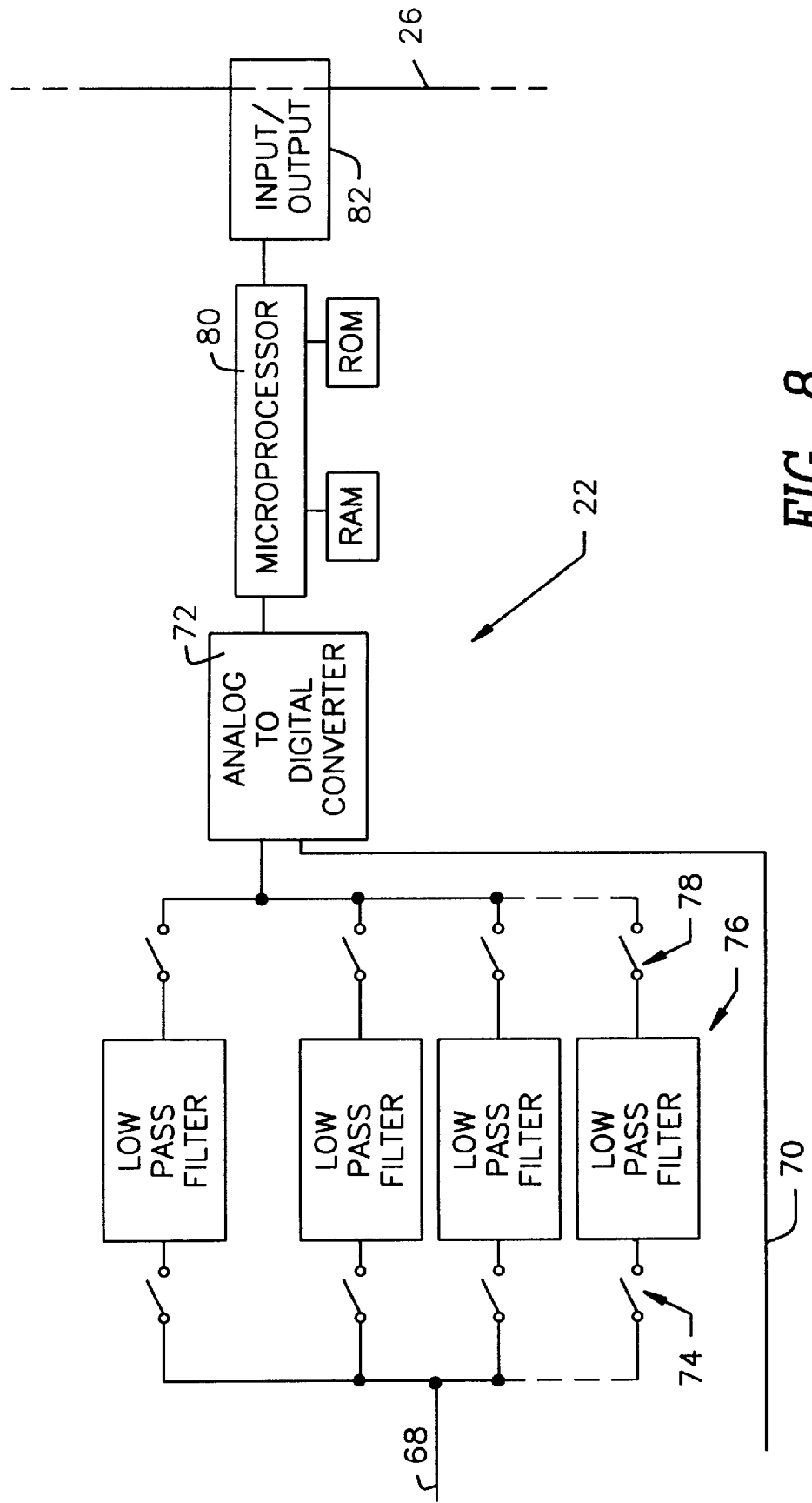
FIG. 8 is a block diagram showing the current measurement system.

As shown in FIG. 8, the current measurement system 22 is similar to the voltage measurement module 20 in that the leads 68, 70 which are connected across the sensing resistor 50 are connected one directly to the analog to digital converter 72 and one through the switches 74, the low pass filters 76 and the switches 78. The current measurement system 22 also includes a microprocessor 80 which, among other things, controls the switches 74, 78.

Each of the voltage measurement modules 20 and the current measurement system 22 includes an input/output circuit 82 coupled to the bus system 26 for receiving instructions from the system/load controller and interface 24 and for transmitting collected voltage measurement data to the system/load controller and interface 24. The system/load controller and interface 24 does preliminary processing of the data and transmits the data to the remote personal computer 28 for final processing and evaluation of battery condition. Thus, the personal computer 28 utilizes the voltage and current measurement data to calculate and/or display the ohmic resistance, the charge transfer resistance and the double layer capacitance for each of the jars, in the manner previously described.

Thus, typically, in a large battery backup or standby system the remote personal computer 28 initiates the collection of voltage measurement data once a week during an off hour. The system/load controller and interface 24 sends signals over the bus system 26 to cause a string of long and short duration current pulses to be applied to each quarter string and to have the voltage measurement module 20 associated with that quarter string take voltage measurements from each jar within that quarter string. During the data collection from each jar, a stream of both long and short duration current pulses are applied to the quarter string. All of the voltage measurement data is collected by the system/load controller and interface 24 and transmitted to the remote personal computer 28 for processing.

The system/load controller includes an internal real time clock and may also be programmed to autonomously take ohmic resistance, charge transfer resistance, and double layer capacitance measurements for each jar at predetermined specific time intervals at predetermined specific times. The acquired data in this case is temporarily stored in the voltage measurement modules as well as the system/load controller for future downloading to the remote personal computer.

Accordingly, there has been disclosed an improved method and system for evaluating the status of battery jars in a battery backup or standby system. While an exemplary embodiment of the present invention has been disclosed herein, it will be appreciated by those skilled in the art that various modifications and adaptations to the disclosed embodiment may be made and it is intended that this invention be limited only by the scope of the appended claims.

What is claimed is:

1. A method for evaluating a battery jar, comprising the steps of:
   a) applying a measured current load to said battery jar in a stepwise manner;
   b) measuring the voltage across said battery jar before said current load is applied;
   c) measuring the voltage across said battery jar at least once during the application of said current load;
   d) determining, from the at least one voltage measurement from the step c), the voltage across said battery jar immediately after said current load is applied;
   e) calculating, from the measured voltage from the step b) and the determined voltage from the step d), the ohmic resistance of said battery jar;
   f) measuring the voltage across said battery jar at least once more during the application of said current load if the step c) provided only one measurement;
   g) determining, from at least the second voltage measurement from the steps c) and f), the steady state voltage across said battery jar in response to said current load; and h) calculating, from the determined steady state voltage from the step g) and the determined voltage from the step d), the charge transfer resistance of said battery jar;

wherein the step a) of applying a measured current load includes the steps of:
   a1) providing a first series of pulses of said measured current and each of a first duration; and
   a2) providing a second series of pulses of said measured current and each of a second duration;

wherein the step e) of calculating the ohmic resistance utilizes measurements taken during said first series of pulses;

wherein the step h) of calculating the charge transfer resistance utilizes measurements taken during said second series of pulses; and wherein said second duration is greater than said first duration.

2. The method according to claim 1 wherein:
said first duration is in the range from about 0.5 ms to about 10 ms; and
said second duration is in the range from about 1 ms to about 50 ms.

3. The method according to claim 1 wherein the step e) of calculating the ohmic resistance includes the step of:
   e1) calculating the voltage difference between the measured voltage from the step b) and the determined voltage from the step d).

4. The method according to claim 3 further including the steps of:
   i) measuring the current applied to said battery jar during the step a); and
   the step e) of calculating the ohmic resistance further includes the step of:
      e2) dividing the voltage difference from the step e1) by the measured current from the step i).

5. The method according to claim 1 wherein the step h) of calculating the charge transfer resistance includes the step of:
   h1) calculating the voltage difference between the determined voltage from the step g) and the determined voltage from the step d).

6. The method according to claim 5 further including the step of:
   i) measuring the current applied to said battery jar during the step a); and
   the step h) of calculating the charge transfer resistance further includes the step of:
      h2) dividing the voltage difference from the step h1) by the measured current from the step i).

7. The method according to claim 1 further comprising the steps of:
   i) utilizing a curve fitting technique to determine, from the at least two voltage measurements from the steps c) and f), the time constant of the voltage response of said battery jar to the stepwise application of the current load; and
   j) calculating, from the determined time constant from the step i) and the calculated charge transfer resistance from the step h), the double layer capacitance of said battery jar.

8. The method according to claim 7 wherein the step j) of calculating the double layer capacitance includes the step of:
   j1) dividing the time constant from the step i) by the charge transfer resistance from the step h).

9. A system for evaluating each of a plurality of rechargeable battery jars arranged in at least one string of serially connected jars, the strings being connected in parallel when there are at least two such strings, the jars of each string being divided into at least two groups, the system comprising:

a switchable current load;

a first controllable switch bank associated with each of the strings and controllable for selectively coupling in a stepwise manner the current load across a selected group of adjacent jars in said each string;

a bus system;

a voltage measurement module coupled to the bus system and associated with each group of adjacent jars in each string, the voltage measurement module including a pair of voltage measurement terminals and a second controllable switch bank associated with the jars of said each group and controllable for selectively coupling one jar of said each group at a time across said pair of terminals, the voltage measurement module being effective to collect data indicative of the voltage across said pair of terminals;

a current measurement system coupled to the bus system and coupled to the switchable current load to collect data indicative of load current;

a controller coupled to the bus system and effective to control the operation of the current load and the first controllable switch bank, the controller being further effective to transmit control signals over the bus system to actuate in turn each voltage measurement module to control the second controllable switch bank and collect voltage data from the jars of the associated said each group of jars, the controller further collecting load current data over the bus system from the current measurement system; and a computer coupled to the controller and effective to cause the controller to control the current load, the first controllable switch bank, each voltage measurement module and the current measurement system so that a current load is applied in a stepwise manner to said each group of adjacent jars one at a time, the voltage measurement module associated with that group collects voltage data from each jar during the stepwise application of load current to that group, and the current measurement system collects current measurement data, the computer being further effective to collect all of the voltage and current measurement data and to utilize the collected data to calculate at least one of the ohmic resistance, the charge transfer resistance and the double layer capacitance for each of the jars;

wherein the voltage measurement module includes:

a plurality of low pass filters;

a first plurality of switches each connected between one of said pair of voltage measurement terminals and a respective one of said low pass filters;

an analog to digital converter;

a second plurality of switches each connected between a respective one of said low pass filters and said analog to digital converter;

a connection between the other of said pair of voltage measurement terminals and said analog to digital converter; and a switch controller arranged so that said first plurality of switches are all initially closed and said second plurality of switches are all initially open, said first plurality of switches are sequentially opened to cause a time-related sequence of voltage measurements to be held in said plurality of low pass filters, and said second plurality of switches are sequentially closed to transfer the time-related sequence of voltage measurements to the analog to digital converter.

10. The system according to claim 9 wherein the controller includes an internal real time clock and is effective to autonomously initiate voltage and current data measurement by the voltage measurement modules and the current measurement system at predetermined specific time intervals at predetermined specific times for subsequent collection by the computer.

11. A system for evaluating each of a plurality of rechargeable battery jars arranged in at least one string of serially connected jars, the strings being connected in parallel when there are at least two such strings, the jars of each string being divided into at least two groups, the system comprising:

a switchable current load;

a first controllable switch bank associated with each of the strings and controllable for selectively coupling in a stepwise manner the current load across a selected group of adjacent jars in said each string;

a bus system;

a voltage measurement module coupled to the bus system and associated with each group of adjacent jars in each string, the voltage measurement module including a pair of voltage measurement terminals and a second controllable switch bank associated with the jars of said each group and controllable for selectively coupling one jar of said each group at a time across said pair of terminals, the voltage measurement module being effective to collect data indicative of the voltage across said pair of terminals;

a current measurement system coupled to the bus system and coupled to the switchable current load to collect data indicative of load current;

a controller coupled to the bus system and effective to control the operation of the current load and the first controllable switch bank, the controller being further effective to transmit control signals over the bus system to actuate in turn each voltage measurement module to control the second controllable switch bank and collect voltage data from the jars of the associated said each group of jars, the controller further collecting load current data over the bus system from the current measurement system; and a computer coupled to the controller and effective to cause the controller to control the current load, the first controllable switch bank, each voltage measurement module and the current measurement system so that a current load is applied in a stepwise manner to said each group of adjacent jars one at a time, the voltage measurement module associated with that group collects voltage data from each jar during the stepwise application of load current to that group, and the current measurement system collects current measurement data, the computer being further effective to collect all of the voltage and current measurement data and to utilize the collected data to calculate at least one of the ohmic resistance, the charge transfer resistance and the double layer capacitance for each of the jars;

wherein the switchable current load includes a sensing resistance, and the current measurement system includes:

a plurality of low pass filters;

a first plurality of switches each connected between a first side of said sensing resistance and a respective one of said low pass filters;

an analog to digital converter;

a second plurality of switches each connected between a respective one of said low pass filters and said analog to digital converter;

a connection between the other side of said sensing resistance and said analog to digital converter; and a switch controller arranged so that said first plurality of switches are all initially closed and said second plurality of switches are all initially open, said first plurality of switches are sequentially opened to cause a time-related sequence of voltage measurements to be held in said plurality of low pass filters, and said second plurality of switches are sequentially closed to transfer the time-related sequence of voltage measurements to the analog to digital converter.

12. The system according to claim 11 wherein the controller includes an internal real time clock and is effective to autonomously initiate voltage and current data measurement by the voltage measurement modules and the current measurement system at predetermined specific time intervals at predetermined specific times for subsequent collection by the computer.

* * * * *